(12) United States Patent
Lavi et al.

(10) Patent No.: US 6,950,977 B2
(45) Date of Patent: Sep. 27, 2005

(54) MECHANISM FOR TURBO DECODING WHEN CRC FOR PARTIAL BLOCKS IS PROVIDED

(75) Inventors: Yoav Lavi, Ra'anana (IL); Alon Boner, Ramat Poleg (IL)

(73) Assignee: 3G.com, Inc., Wilmington, DE (US)

(*) Notice: Subject to any disclaimer, the term of this patent is extended or adjusted under 35 U.S.C. 154(b) by 580 days.

(21) Appl. No.: 10/097,609

(22) Filed: Mar. 15, 2002

(65) Prior Publication Data

US 2002/0166095 A1 Nov. 7, 2002

Related U.S. Application Data

(60) Provisional application No. 60/275,674, filed on Mar. 15, 2001.

(51) Int. Cl.[7] ............................................. H03M 13/03
(52) U.S. Cl. ....................................... 714/794; 714/758
(58) Field of Search ................................ 714/794, 758, 714/788, 786, 704; 375/340; 341/50

(56) References Cited

U.S. PATENT DOCUMENTS

| | | | |
|---|---|---|---|
| 5,446,747 A | * | 8/1995 | Berrou .......................... 714/788 |
| 5,761,248 A | | 6/1998 | Hagenauer et al. |
| 6,182,261 B1 | * | 1/2001 | Haller et al. ................. 714/758 |
| 6,487,694 B1 | * | 11/2002 | Bajwa .......................... 714/786 |
| 6,526,531 B1 | * | 2/2003 | Wang ........................... 714/704 |
| 6,614,858 B1 | * | 9/2003 | Pekarich et al. ............. 375/340 |
| 6,686,853 B2 | * | 2/2004 | Shen et al. ................... 341/50 |

OTHER PUBLICATIONS

C. Berrou and A. Glavieux, Turbo–Codes: General Principles and Applications, *Audio and Video Digital Radio Broadcasting Systems and Techniques*, 1994, pp. 215–226, Ecole Nationale Supérieure des Télécommunications de Bretagne, BP 832–29285, Brest Cedex, France.

C. Berrou, A. Glavieux and P. Thitimajshima, Near Shannon Limit Error—Correcting Coding and Decoding: Turbo–Codes (1), 1993, pp. 1064–1070, Ecole Nationale Supérieure des Télécommunications de Bretagne, BP 832–29285, Brest Cedex, France.

* cited by examiner

*Primary Examiner*—David Ton
(74) *Attorney, Agent, or Firm*—Sughrue Mion, PLLC

(57) ABSTRACT

A system and method for improving error detection and correction for transmitted data. An iterative error detection method is used to determine a relative likelihood that decoded data is an accurate representation of the original data. An independent error correction unit operates on the decoded data and a result from the independent error correction unit is injected into the iterative error detection method to improve the reliability of the error detection method.

19 Claims, 6 Drawing Sheets

FIG. 5A

| Block 1 | 1 | 2 | 3 | 4 | 5 |
|---------|----|----|----|----|----|
| Block 2 | 6 | 7 | 8 | 9 | 10 |
| Block 3 | 11 | 12 | 13 | 14 | 15 |
| Block 4 | 16 | 17 | 18 | 19 | 20 |

FIG. 5B

| Order of data in interleaved data | Original address (or order) |
|---|---|
| 1 | 1 |
| 2 | 6 |
| 3 | 11 |
| 4 | 16 |
| 5 | 2 |
| 6 | 7 |
| 7 | 12 |
| ... | ... |

FIG. 5C

| Range of numbers | Block number | Has the block passed CRC? (1- yes, 0-no) |
|---|---|---|
| 1-5 | 1 | 0 |
| 6-10 | 2 | 1 |
| 11-15 | 3 | 1 |
| 16-20 | 4 | 0 |

MECHANISM FOR TURBO DECODING WHEN CRC FOR PARTIAL BLOCKS IS PROVIDED

CROSS REFERENCE TO RELATED APPLICATIONS

This application is an application filed under 35 U.S.C. § 111(a) claiming benefit pursuant to 35 U.S.C. § 119(e)(1) of the filing date of the Provisional Application 60/275,674 filed on Mar. 15, 2001 pursuant to 35 U.S.C. § 111(b).

FIELD OF THE INVENTION

The present invention relates generally to the field of error detection and correction for digital communications and more particularly to the area of turbo-coding and cyclic redundancy checking (CRC).

BACKGROUND OF THE INVENTION

A known algorithm used for the correction of errors when data is transmitted in a noisy environment is known as turbo-decoding. In turbo-decoding, data bits to be transmitted are divided into block, and for each block, special bits are added and transmitted along with the data bits. The special bits that are added to each block enable the recovery of the original data, which is most beneficial in situations where the transmission is prone to noise that can corrupt the data when transmitted. The basic concepts involved in turbo-decoding are described, for example in Berrou, C., Glavieux, A. and Thitimajshima, P., *Near Shannon Limit Error-Correcting Coding and Decoding: Turbo Codes, ICC*, pp 1064–1070, 1993; and Berrou, C et. al., *Turbo Codes: General Principles and Applications*, Proceedings of the 6th Tierrenia International Workshop of Digital Communications, Tierrenia, Italy, September 1993, as well as in U.S. Pat. No. 5,446,747, all of which are incorporated herein by reference for all purposes.

The basic operation of a conventional turbo-decoder is discussed at length in the references mentioned above. Each of the conventional methods related to turbo-decoding discussed in the references mentioned above is based on several iterations performed on each block of data. As each iteration is conducted, gradually more and more errors are corrected until no further errors remain. In some real-time systems, the time dedicated to perform the iterations is limited and, thus, the decoding operation is stopped after several iterations, whether the data is error-free or not. This is one reason that it is important that the quality of the decoded data improve from one iteration to the next.

In addition to turbo-decoding, many practical systems use additional independent means to minimize the errors in the transmitted data. For example, in 3GPP standards for wireless communication, cyclic redundancy check (CRC) blocks are added to the transmitted data. The length of the CRC blocks may or may not coincide with the length of the turbo-decoder block. Each CRC block is attached at the end of a respective transport block. Subsequently, several such CRC blocks can be concatenated to form a code block.

Conventional methods of turbo-decoding only deal with cases where the coded frame contains a single CRC code block (where "block" means the original data and the CRC generated for the original data). For example, a device disclosed in U.S. Pat. No. 5,761,248, the disclosure of which is incorporated herein by reference for all it teaches, discloses a method for determining an adaptive abort criteria. Further, a device disclosed in U.S. Pat. No. 6,182,261, the disclosure of which is also incorporated herein by reference for all it teaches, stops the iteration process if the CRC check passes. Neither of the devices disclosed in these two patents addresses the situation where there is a plurality of CRC code words in the same coded data frame. Furthermore, the two patents mentioned do not describe how to handle, or even recognize, the situation where some of the CRC code words pass the CRC check and some of the CRC code words fail the CRC check.

FIG. 1 depicts a block diagram of a typical conventional turbo encoder (1). Data comprising a number of bits to be encoded enters the Interleaver (10) wherein the bits are intermixed in a pseudo-random manner. For example, a common method of interleaving is to form a matrix, e.g., writing into the matrix in rows and reading out from the matrix in columns, with a possible permutation of the row and/or column order being between the writing and the reading. At the same time data is input to the Interleaver (10), the same data bits are also input to the First RSC (Recursive Systematic Convolutional) Encoder block (11), from which a first parity bit is output for every input bit. The output of the Interleaver (10) enters a Second RSC Encoder block (12), where a second parity bit is generated. Thus all the parity bits are generated by recursive systematic convolutional encoders, which are commonly known.

MUX (13) alternately selects bits from the original data, i.e., the "Systematic" bits, and the two parity bits output respectively from the first and second RSC encoding blocks. Thus, for every bit at the input to the Turbo Encoder (1), each of three different bits are alternately output—a Systematic Bit, a First Parity Bit and a Second Parity Bit.

FIG. 2 shows a prior art implementation technique for a conventional turbo-decoder as explained, for example, in the references mentioned above.

In particular, a Systematic Bit and a First Parity Bit enter Decoder 1 (20). Additionally, extrinsic information for each bit, as calculated during the previous iteration, enters Decoder 1 (20) as well. The output of Decoder 1 (20) comprises a new extrinsic value for each input bit. For example, a "extrinsic" number comprises a digital representation of how likely the original data bit was a "0" or how likely the original data bit was a "1". The range of values for the extrinsic number can be, for example, from −7 to +7. A "strong zero", or in other words, a representation that the bit is most likely a "0" can be shown as −7 and a representation that the bit is most likely a "1" can be shown as +7, with varying degrees of "extrinsic" being represented by the numbers between −7 and +7.

As shown in FIG. 2, the new extrinsic value enters Interleaver (21), which is typically identical in function to Interleaver (10) shown in the Encoder of FIG. 1. Interleaver (21) performs any of a variety of different interleaving algorithms on the input data. The output from Interleaver (21), along with the Second Parity Bit, enters a second decoder, Decoder 2 (22). Decoder 2 (22) calculates a new extrinsic value based on the extrinsic value from Interleaver (21) together with the Second Parity Bit. The new extrinsic value from Decoder 2 (22) takes into account the former extrinsic value, i.e., from Decoder 1 (20), and the additional information (Second Parity Bit) to form a better estimate for the true value of the input data. Decoder 2 (22) then feeds its output to De-Interleaver (23), which feeds the de-interleaved extrinsic value back to Decoder 1 (20) for another iteration. Thus, the likelihood of "knowing", and ultimately outputting, the correct value for the data bit, i.e., "1" or "0", increases from iteration to iteration.

The output from De-Interleaver (23) also feeds a Hard Decision block (24), which translates the extrinsic information output from De-Interleaver (23) into a hard decision (i.e., "1" or "0"). The Hard Decision output is then presented to a CRC Check block (25), which uses a standard CRC checking algorithm to determine if the output sequence of hard decisions from Hard Decision block (24) is correct. If the CRC test fails, nothing can be done, except at the system level where it may be possible to request a complete retransmission of the data.

An entirely turbo-decoded block of data must be written into the Interleaver (21) before the output of Interleaver (21) can be fed to Decoder 2 (22). The reason for this is because the interleaving process is defined so that all (or almost all) input bits must be stored before the output bits can be generated. This is true for De-Interleaver (23) as well. Accordingly, the circuit works in two distinct phases, as follows:

Phase 1: through Decoder 1 (20) and output from Interleaver (21). In this phase, the data is in interleaved order and therefore the CRC cannot be checked.

Phase 2: through Decoder 2 (22) and out from De-Interleaver (23). Only in this phase can the CRC be checked.

Also, the length of a CRC block does not necessarily coincide with the length of the Turbo Decoder block.

FIG. 3 depicts an example for a single turbo-decoder block, which consists of three CRC units, each of which has a data block terminated by a CRC trailer.

OBJECTS OF THE INVENTION

In view of the issues raised above in regard to inefficient and/or ineffective decoding, an object of the present invention is to provide a system and method of error correcting relative to data transmission in which time requirements and power consumption in the decode process are reduced.

SUMMARY OF THE INVENTION

To achieve the above-mentioned object of the present invention, a system in accordance with one embodiment of the present invention includes most of the functional structures required to carry out a conventional turbo-decode process, a process that is fully described in the references incorporated hereinabove. In addition to the functional structures traditionally required, however, a system in accordance with the present embodiment includes several novel functional structures for reducing both the time required to carry out the turbo-decode process as well as the power consumed by the system in the process.

For example, the present embodiment includes a turbo-coding system including a turbo-encoder for encoding data to be transmitted and a turbo-decoder for receiving the transmitted data as turbo code blocks and decoding the data. The turbo-decoder also verifies that the reliability of the received data is above a certain degree of reliability. The turbo-decoder in this embodiment includes a CRC checking unit that determines whether each code block either passes or fails a CRC checking algorithm. If the code block passes the CRC checking algorithm, the results of the CRC checking algorithm are fed back to the iterative turbo-decoding process. As a result of the information fed back from the CRC checking algorithm, the turbo decoding process is able to increase the speed by which errors are corrected and, thus, both time and energy are conserved.

In accordance with the present embodiment, when a code block passes a respective CRC check, an address calculator and a range check unit are activated. Also, until the CRC check unit determines that a particular CRC block passes the CRC check algorithm, an extrinsic saturation unit is controlled to be OFF. While in the OFF condition, the extrinsic saturation unit acts as a conduit for interleaved data leaving the interleaver unit, i.e., so-called 'soft' data, and the second decoder.

However, as soon as the CRC check unit determines a 'pass' result for a particular code block, the range check unit, which has been activated by the CRC check unit, turns ON the extrinsic saturation unit for all data corresponding to the code block that resulted in the passed CRC. The extrinsic saturation unit, thus, 'saturates' the extrinsic data for each of the bits of data that made up the passed CRC code block. In other words, the data into the turbo-decoder's second decoder is set at the data's corresponding maximal soft value.

The second decoder operates as usual on the saturated data and after decoding the data, passes the decoded data along to the De-Interleaver where the original order of the data is retrieved. Experience has shown that the saturated data, resulting from the code block that passes the CRC, will improve the performance of the of the Turbo decoder in such a way that bits that do not correspond to the passing CRC will get better soft symbols, and as a result, the turbo decode process is halted sooner than it would have been had the CRC check result not been injected into the intermediate processing of the overall turbo-decode process.

BRIEF DESCRIPTION OF THE DRAWINGS

The invention as well as embodiments and advantages thereof are described below in greater detail, by way of example, with reference to the drawings in which:

FIG. 5A shows an example of how data might be stored in an interleaver.

FIG. 5B shows an example of an address calculator in accordance with one embodiment of the present invention.

FIG. 5C shows an example of a range checker in accordance with one embodiment of the present invention.

DETAILED DESCRIPTION OF THE PREFERRED EMBODIMENTS

Figure 4:
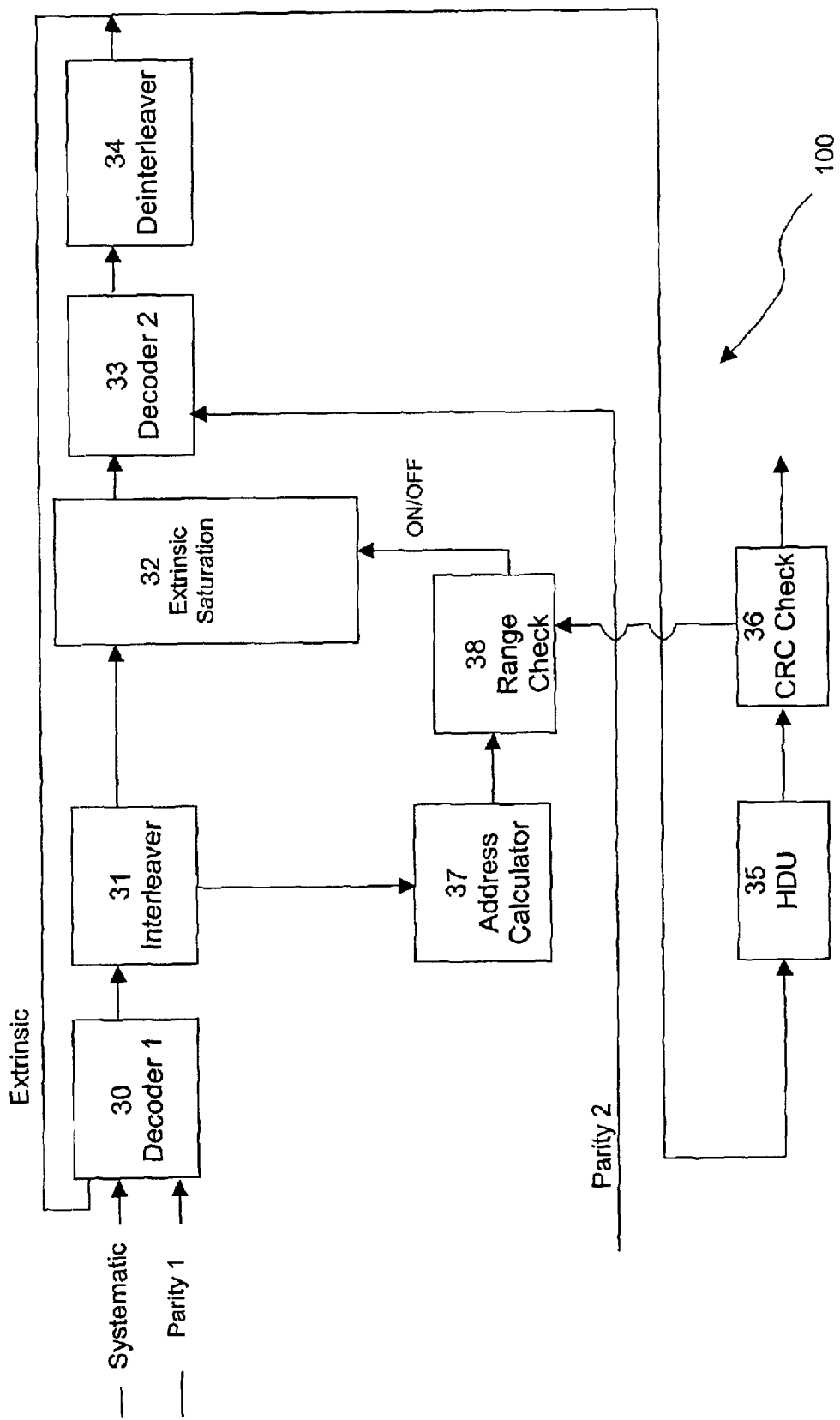
FIG. 4 is a block diagram illustrating one embodiment in accordance with the present invention.

FIG. 4 depicts a circuit (100) in accordance with one embodiment of the present invention. Circuit (100) represents an improved version of the decoder shown in FIG. 2 in which both time and energy are conserved by taking advantage of CRC pass/fail data to speed up and increase the reliability of the iterative decoding process. In particular, in regard to circuit (100), if the CRC result from CRC check (36) corresponding to a specific CRC block passes the check routine, the iterative process is halted and circuit (100) is controlled to perform a hard decision on those symbols that comprise the subject block, i.e., the block that resulted in the 'pass' condition in the CRC check.

In particular, upon determining a 'passed' CRC check, Extrinsic Saturation block (32) forces "saturation" (i.e., maximal soft value) of the extrinsic value on the data stream. The extrinsic value comprises words of several bits. The number of bits used for the extrinsic value is arbitrary, however, typically 3–5 bits of data are used to represent extrinsic information. In the example discussed above, where the extrinsic information value ranged from −7 to +7, four bits were used; one bit to represent the sign of the number (− or +) and three bits to represent the actual value (0–7). Thus, each extrinsic "word" can be regarded as the binary representation of an integer, either positive or negative. These integers represent extrinsic values. The largest integer that can be represented with the given number of bits is the 'maximal soft value'.

From the time the first turbo-decode iteration begins, and until a first CRC check results in a "pass" condition, the extrinsic saturation block (32) is in the OFF position, that is, it does not saturate the extrinsic value but it does transfer the soft symbols from its input to its output. In other words, until the CRC check unit (36) determines a "pass" for a particular block, circuit (100) operates exactly like the decoder circuit depicted in FIG. 2.

When the CRC check unit (36) determines its first 'passed' CRC block, the address calculation unit (37) and the range check unit (38) are activated. The range check unit (38), in turn, turns the Extrinsic Saturation unit (32) ON for all symbols that correspond to the present CRC block. Extrinsic Saturation unit (32) subsequently sets the reliability value of the instant bit to its respective maximal soft value, provided that the bit belongs to a sub-frame with a "passed" CRC. In other words, after the CRC makes its first 'passed' determination, the Extrinsic Saturation unit (32) is controlled to set each extrinsic value for the corresponding data block (i.e., the block that passed its CRC) to its maximum value. That is, relatively weak "0"s and "1"s are converted into very strong "0s" and "1"s, respectively.

In accordance with the present embodiment, half an iteration is consumed by the time the CRC makes its determination. In other words, half an iteration is wasted because after the first phase, as the data is output from Interleaver (31), the data is still in interleaved order and, thus, CRC checking cannot be performed yet. The CRC check unit (36) determines whether a CRC block 'passes' the CRC algorithm only after all symbols are output from the De-Interleaver (34), i.e., after the second phase, when the data has already been fed back to and decoded by Decoder 1 (30), and stored in Interleaver (31). Therefore, it is only possible to force a hard-decision at the next half-iteration, e.g., when symbols are transferred from Interleaver (31) to Decoder 2 (33), and into De-Interleaver (34). Accordingly, a mechanism is required to keep track of the data and its corresponding interleaved ordering such that when the CRC determines a 'pass' for a particular block immediately following the second phase, the corresponding data that has been fed back to the first phase and, thus interleaved, can be retrieved properly and operated on by the Extrinsic Saturation unit (32). For this purpose, Address Calculator (37) and Range Check unit (38) are provided.

When symbols are read from Interleaver (31), the addressing order is such that interleaving occurs, e.g., symbols that were written in rows are read in columns. Any type of interleaving algorithm can be used, e.g., a square interleaver, a triangle interleaver or a random interleaver. Those skilled in the art would know how to build and/or use an Interleaver and the present invention is not limited to any one type of interleaving algorithm. As a result of interleaving, the range of addresses for a certain CRC block is not continuous when read from Interleaver (31). The addresses corresponding to the data in Interleaver (31) are calculated by the Address Calculator (37). For example, the structure of the interleaved block output from Interleaver (31) is such that the information is written in consecutive addresses, and interleaving is performed by controlling the order of the read operation.

A description in accordance with the present embodiment in regard to the Address Calculator (37) and the Range Check unit (38) is now provided.

A task of the Address Calculator (37) is to generate the original address of the location into which the data was originally written into Interleaver (31). It is necessary to keep track of this information because there is a difference in the order of the data being read from the Interleaver (31), as compared to the order as the data is written into the Interleaver (31). The difference in addresses is a function of the interleaver algorithm used.

A task of the Range Check unit (38) is to identify which of the data blocks the current sample corresponds to and determine whether the current sample has passed the CRC check in the previous round and should now be changed to the maximum value, as discussed above, or maintained at its current value. The operation of the Range Check unit (38) is, therefore, also specific to the algorithm used in the interleaving, and also specific to the size of the code blocks. For example, consider a simple square interleaver having blocks of 4 bits each, and each block having a corresponding CRC value comprising a single bit. If it is assumed that there are four such blocks to transfer, the four data bits in the first block are numbered 1–4 and the CRC bit is numbered 5. The data bits in the second block are numbered 6–9 with the corresponding CRC bit numbered 10, and so on for the third and fourth blocks. Therefore, the numbering of the bits for all four blocks (20 bits) is 1, 2, 3, 4, . . . 19, 20. When the data is written into the Interleaver (31), the data structure shown in FIG. 5A results.

Referring to FIG. 5A, data is read in the interleaved manner. That is, for a square interleaver, data written into the interleaver in rows is read columns, e.g., in the order 1, 6, 11, 16, 2, 7, 12 . . . until the end of the block is reached. Address Calculator (37) takes the data being read from Interleaver (31) in interleaved order and generates the original address. For example, Address Calculator (37) may include a lookup table, an algorithmic function run in software and/or hardware, or any other mechanism whereby the original addresses can be retrieved. FIG. 5B represents an exemplary lookup table that could be used in Address Calculator (37) showing the correspondence between the interleaved data in the example above, and the corresponding original address within the interleaver.

As mentioned above, a task of the Range Check unit (38) is to determine whether the current data belongs to a data block that has 'passed' the CRC check. For example, considering the second data sample read from Interleaver (31), according to the address generator table of FIG. 5B, the original address was 6, thus the data sample read belongs to block number 2. The Range Check unit (38) takes the number, i.e., 6 in this example, from the Address Calculator (37), identifies which block the number belongs to, i.e., block number 2 in this example, and determines whether the particular block has passed the CRC in the previous cycle.

Thus, the Range Check unit (38) may comprise a table, such as the table shown in FIG. 5C, from which it can read the data. In FIG. 5C, three columns of data represent the range of numbers, the corresponding block number and the corresponding CRC pass result provided by the CRC Check unit (36), respectively. If, as shown in FIG. 5C, there exists an indication that at least one of the blocks has 'passed' the CRC, then the Range Check unit (38) activates the Extrinsic Saturation unit (32) and the corresponding extrinsic values for the data of that block are maximized, as discussed above. Further, the data in the third column of FIG. 5C, the CRC result data, is updated by the CRC every time the CRC performs a CRC calculation.

In accordance with the present embodiment, the read address for each symbol read from Interleaver (31) corresponds to the order in which that symbol was written into the block. That is, when the n-th symbol, that was previously written into De-Interleaver (34), is read out of De-Interleaver (34), the read address is 'n'. The read address can be used by the Range Check unit (38) to determine whether or not each symbol belongs to a CRC group which has already passed CRC check.

Thus, a real-time system results in which the turbo-decoding process is improved, by using the CRC result in the iterative turbo-decoding process, and power consumption is conserved since the iterative process is halted and a hard decision is forced for at least some of the decoded data as soon as the CRC determines a 'pass'.

Figure 6:
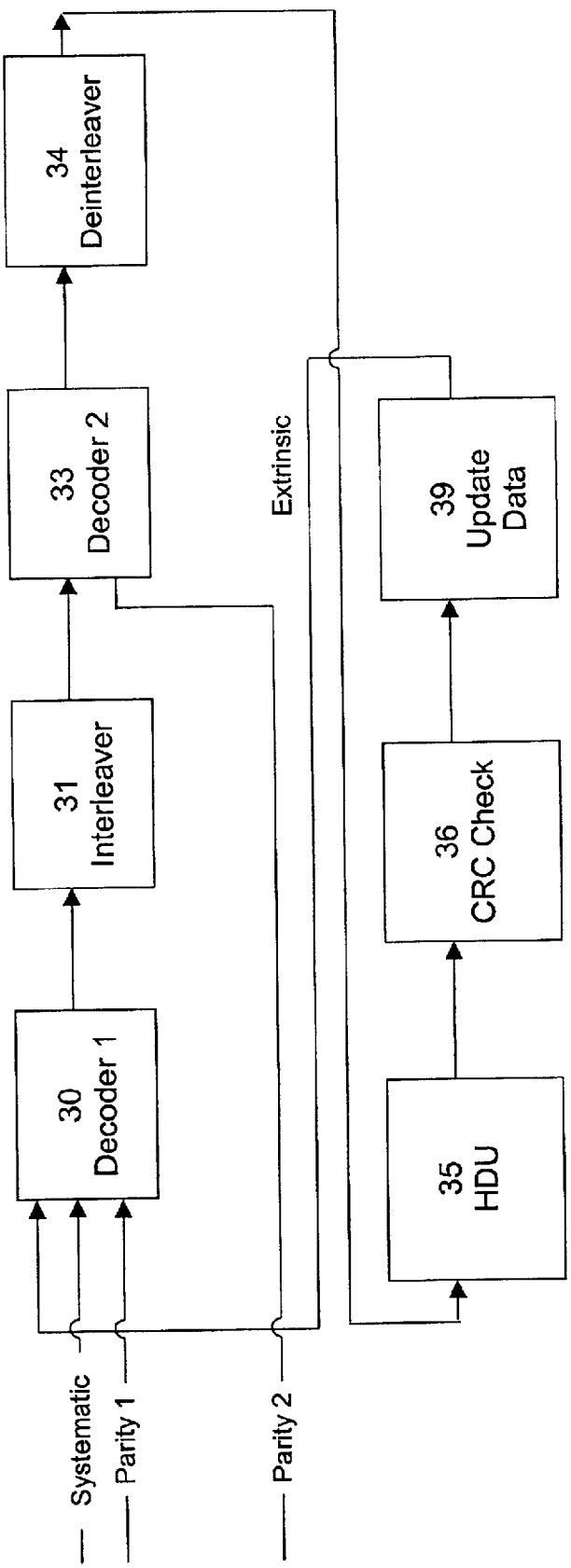
FIG. 6 is a block diagram illustrating a second embodiment in accordance with the present invention.

FIG. 6 illustrates another embodiment of the present invention. According to the embodiment of FIG. 6, an Update Data unit (39) is provided to receive the results of the CRC Check unit (36) and update the data, accordingly. The Update Data block (39) is basically added to the end of a conventional turbo decoder, however, the Update Data unit (39) uses the CRC result to modify the data and feed the modified data back into the front end of the turbo decoder. This embodiment differs from the previous embodiment in that the present embodiment cannot be performed in real-time, since it requires additional time to consider the CRC result and modify the data.

Figure 1:
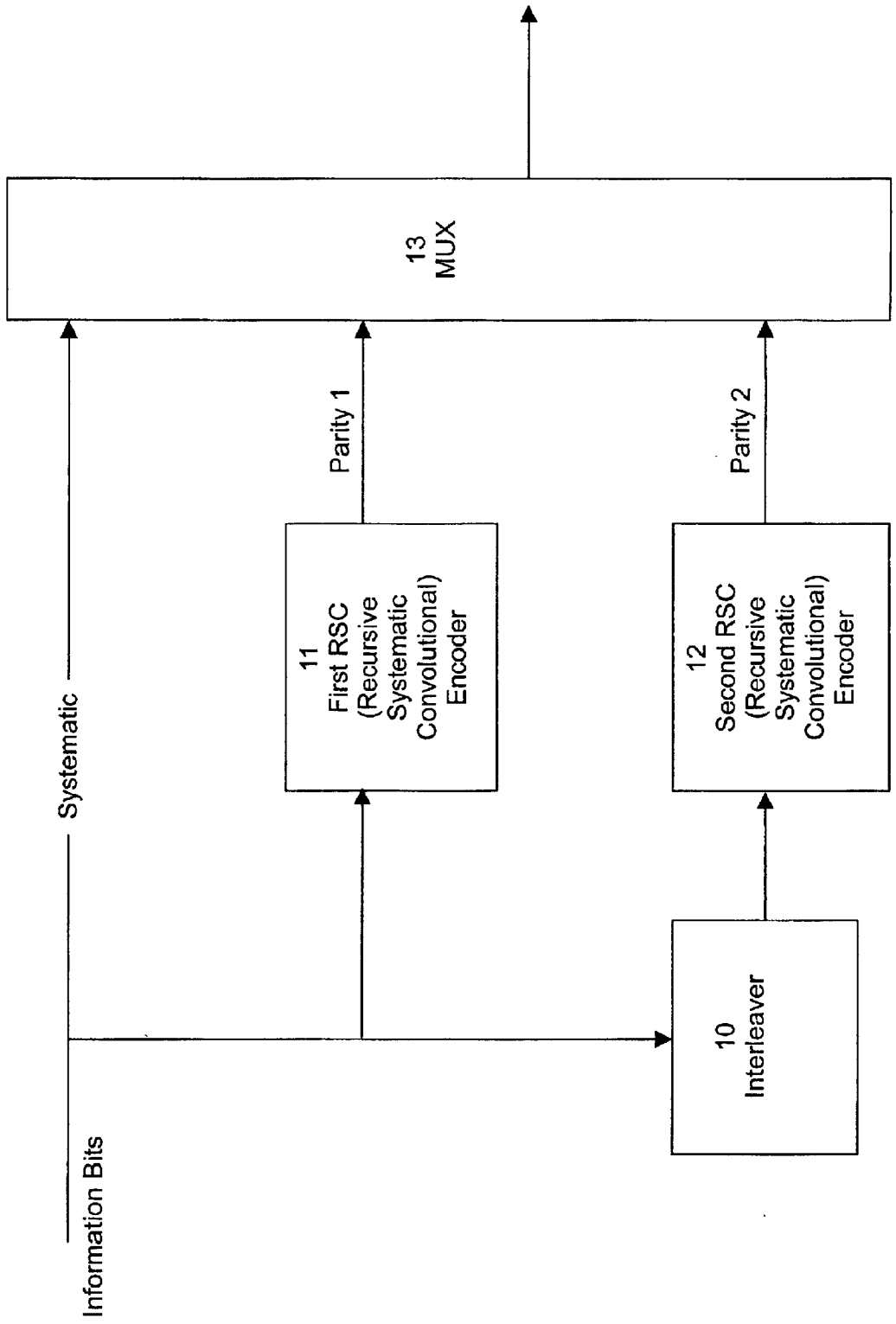
FIG. 1 is a block diagram of a conventional turbo encoder.
Figure 2:
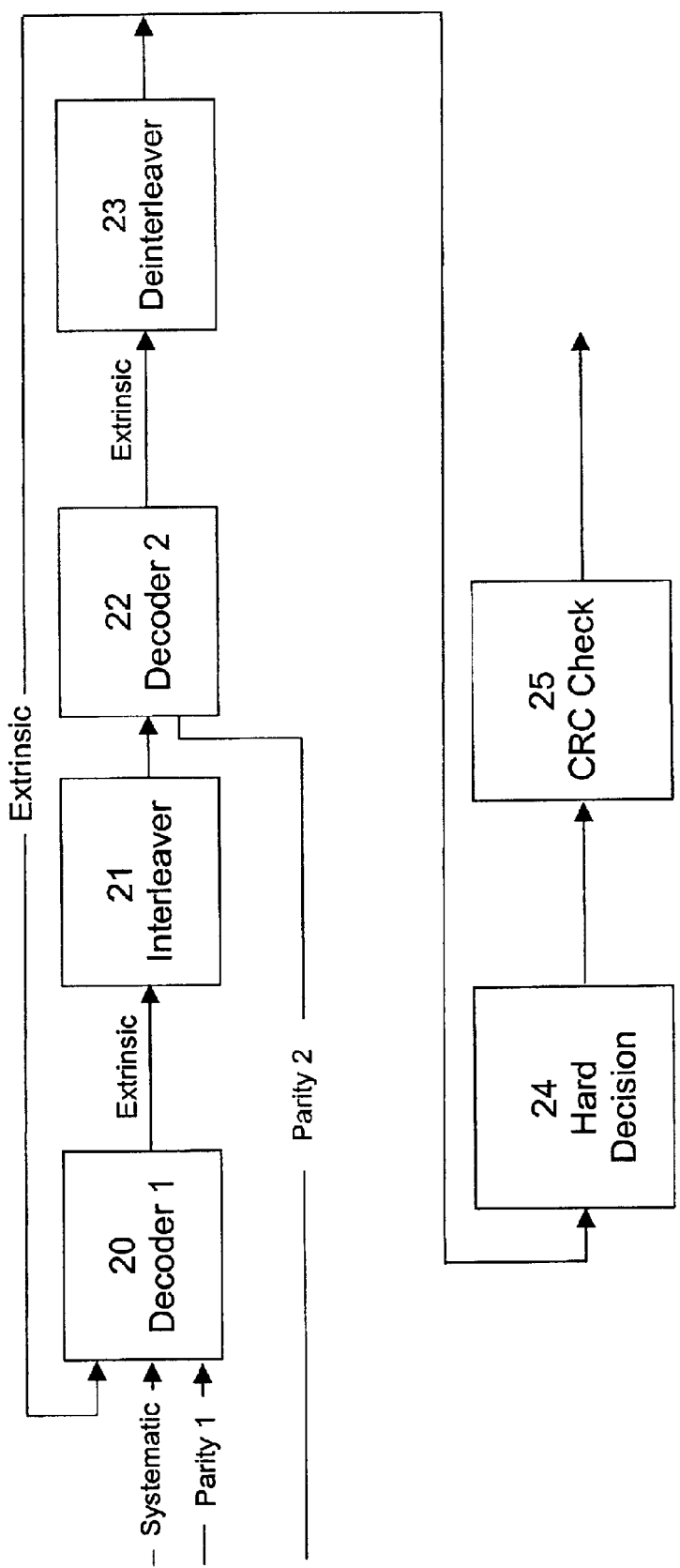
FIG. 2 is a block diagram of a conventional turbo decoder.
Figure 3:
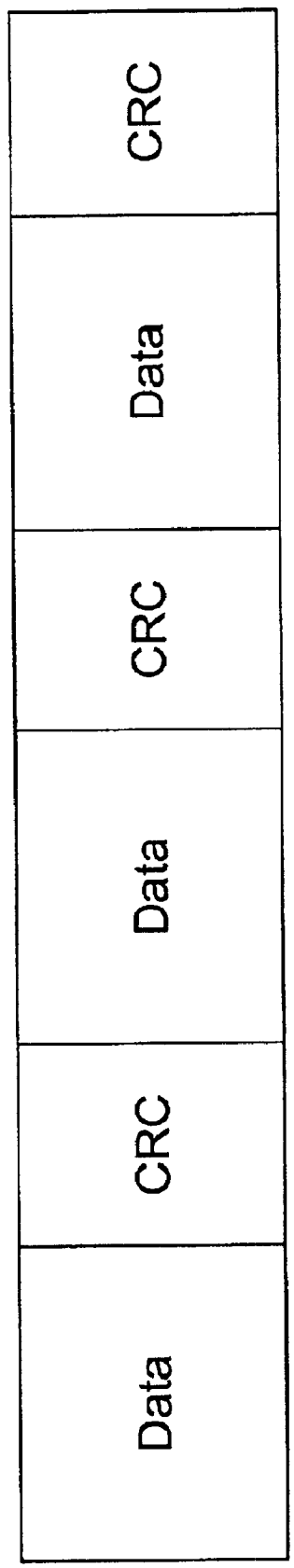
FIG. 3 illustrates an example of a single turbo-decoder block, which consists of three CRC units, each of which has a data block terminated by a CRC trailer.

However, for applications in which the latency required to update the data and rerun the turbo decoder process can be tolerated, an improvement over the conventional turbo-decoder process shown in FIG. 2 is achieved. For example, in the present embodiment, the CRC result is used to update the data and feed the updated data back through the iterative turbo-decoder, as opposed to the conventional methods where the CRC result is used merely as an additional error detection technique after the turbo decoder has completed its decode process.

One of the advantages of the present invention over conventional turbo-code methods is that additional information, e.g., CRC data, is used throughout the turbo-decoding process. Using the additional information results in a smaller number of iterations, statistically, and, hence, lowers the overall power consumption of the encoding/decoding circuits.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all such changes and modifications as fall within the spirit and scope of the invention, as defined by the appended claims, and equivalents thereof.

What is claimed is:

1. An error correction system for correcting errors in transmitted digital data, the system comprising:
    an encoder operable to encode original data, forming encoded data;
    a decoder operable to decode the encoded data, forming decoded data, and determine a likelihood value corresponding to the decoded data, wherein the likelihood value is iteratively determined and represents a relative likelihood that the decoded data is an accurate representation of the original data;
    a hard decision unit operable to output a final value corresponding to the decoded data when the likelihood value exceeds a given threshold; and
    a likelihood saturation unit operable to force the likelihood value to a maximum likelihood value.

2. An error correction system as set forth in claim 1, further comprising:
    an auxiliary unit operable to perform an independent error correction algorithm on the decoded data and control said likelihood saturation unit in accordance with a result of the independent error correction algorithm.

3. An error correction system as set forth in claim 2, wherein the an independent error correction algorithm is a cyclic redundancy check (CRC) algorithm.

4. An error correction system as set forth in claim 1, wherein said decoder is a turbo-decoder.

5. An error correction system as set forth in claim 4, wherein said decoder comprises:
    an interleaver operable to receive intermediate data and output interleaved data, wherein the interleaved data includes the intermediate data in a format different from a format of the intermediate data; and
    an address calculator operable to determine a correspondence between the format of the intermediate data and the format of the interleaved data.

6. An error correction system as set forth in claim 5, wherein said address calculator comprises a software algorithm.

7. An error correction system as set forth in claim 1, wherein prior to the likelihood saturation unit forcing the likelihood value to the maximum likelihood value, the likelihood value is lower than the maximum likelihood value.

8. An error correction system as set forth in claim 1, wherein the likelihood saturation unit has an OFF condition and an ON condition, and wherein the likelihood saturation unit forces the likelihood value to the maximum likelihood value only in the ON condition.

9. An error correction system as set forth in claim 8, further comprising a cyclical redundancy check unit operative to determine whether the decoded data meets a cyclical redundancy check criteria, and wherein the likelihood saturation unit is switched to an ON condition when a satisfactory result is output from the cyclical redundancy check unit.

10. A turbo-coding system comprising:
    a turbo-decoding unit operative to receive a plurality of data packets, each data packet comprising primary data and CRC data, and iteratively decode said data packets, wherein said turbo-decoding unit comprises,
    a CRC checker operative to determine whether said CRC data corresponding to each data packet satisfies predetermined CRC criteria; and
    a likelihood saturation unit operative to change respective values of said data packets based on the determination made by said CRC checker.

11. A turbo-coding system as set forth in claim 10, wherein said turbo-decoding unit further comprises an address calculator operable to determine a respective address for each data word stored in a first interleaver unit.

12. A turbo-coding system according to claim 10, wherein the likelihood saturation unit changes the respective values of said data packets when said CRC checker makes a determination that the CRC data corresponding to each data packet satisfies the predetermined CRC criteria.

13. A turbo-coding system according to claim 12, wherein when the CRC checker makes a determination that the CRC data corresponding to each data packet does not satisfy the predetermined CRC criteria, the likelihood saturation unit remains in an off state.

14. A turbo-decoder operable to decode data blocks encoded by a turbo-encoder, the turbo-decoder comprising:

a first decoder operable to receive and perform a first decode operation on a data block, the data block comprising corresponding a plurality of pairs of primary data and CRC data, the primary data comprising individual bits of data;

an interleaver unit operable to receive decoded data blocks from said first decoder and intermix and store the individual bits of decoded data relative to each data block;

a likelihood saturation unit connected to said interleaver unit and operable to receive the intermixed bits of data output from said interleaver unit and further operable to either change respective values of the intermixed bits of data or maintain the present values of the intermixed bits of data and output the result, wherein a determination whether to change the data values or maintain the present values in said likelihood saturation unit is based on an input signal from an external source.

15. A turbo-decoder as set forth in claim 14, further comprising:

a CRC check unit operable to determine whether the CRC data of any corresponding data packet passes a CRC algorithm, wherein said likelihood saturation unit is controlled by a result of said CRC check unit.

16. A method for improving an iterative turbo decoding process, said method comprising:

receiving encoded data into a decoder, wherein the encoded data includes primary data and independent error correction data;

iteratively decoding said primary data in the decoder, wherein a number of errors contained within the primary data decreases upon each iteration;

performing an independent error correction algorithm on the independent error correction data;

changing values of the decoded data based on a result of the independent error correction algorithm.

17. A decoder used in an error correction system for correcting errors in transmitted encoded data, the decoder comprising:

a decoding portion operable to decode the encoded data and determine a likelihood value corresponding to the decoded data, wherein the likelihood value represents a relative likelihood that the decoded data is an accurate representation of the encoded data;

an error correction portion operable to receive the decoded data and determine whether there are errors in the decoded data; and a data update portion operable to modify the decoded data based on the determination of said error correction portion and provide said decoding portion with the modified data, wherein a number of errors in the encoded data is iteratively reduced.

18. A decoder as set forth in claim 17, wherein the decoder portion is a turbo-decoder.

19. A decoder as set forth in claim 18, wherein the error correction portion is a cyclic redundancy check (CRC).

* * * * *